United States Patent [19]
Habuka et al.

[11] Patent Number: 5,755,878
[45] Date of Patent: May 26, 1998

[54] METHOD FOR VAPOR PHASE GROWTH

[75] Inventors: Hitoshi Habuka; Masanori Mayuzumi, both of Gunma-ken, Japan; Naoto Tate, Camas, Wash.; Masatake Katayama, Gunma-ken, Japan

[73] Assignee: Shin-Etsu Handotai Co., Ltd., Tokyo, Japan

[21] Appl. No.: 546,867

[22] Filed: Oct. 23, 1995

[30] Foreign Application Priority Data

Oct. 25, 1994 [JP] Japan .................... 6-284234

[51] Int. Cl.$^6$ ............................ C30B 23/03
[52] U.S. Cl. .................... 117/90; 117/84; 117/93; 117/103; 427/248.1; 427/255
[58] Field of Search .................... 117/84, 90, 93, 117/103; 427/248.1, 255

[56] References Cited

U.S. PATENT DOCUMENTS

| | | | |
|---|---|---|---|
| 4,745,088 | 5/1988 | Inoue et al. | 437/102 |
| 5,221,556 | 6/1993 | Hawkins et al. | 427/255 |
| 5,304,247 | 4/1994 | Kondo et al. | 118/715 |
| 5,392,730 | 2/1995 | Kondo et al. | 117/102 |

FOREIGN PATENT DOCUMENTS

| | | |
|---|---|---|
| 0559326A1 | 9/1993 | European Pat. Off. |
| 5275797 | 9/1990 | Japan |

OTHER PUBLICATIONS

"Pseudomorphic n–InGaP/InGaAs/GaAs grown by MOVPE for HEMT LSIs"; Takikawa, et al; Journal of Crystal Growth, 107 (1991) Jan. Nos. 1/4, Amsterdam N.L.

*Primary Examiner*—Felisa Garrett
*Attorney, Agent, or Firm*—Ronald R. Snider

[57] ABSTRACT

In the formation of a thin film on the surface of a semiconductor crystal substrate by using a horizontal type vapor phase growth apparatus, the distribution of the thickness and resistivity of the thin film can be properly obtained by adjusting the concentration distribution of the raw material gas in the mixture gas in the width direction of the reaction vessel over the substrate surface. And in the reaction vessel, carrier gas is supplied from the position close to the transfer port of the substrate, and raw material gas is supplied from the position located in the downstream side of a vortex generation region caused by the flow of the carrier gas.

3 Claims, 6 Drawing Sheets

DISTANCE FROM SUBSTRATE CENTER (mm)

DISTANCE FROM SUBSTRATE CENTER (mm)

METHOD FOR VAPOR PHASE GROWTH

BACKGROUND OF THE INVENTION

Field of the Invention

This invention relates to a method and an apparatus for the vapor phase growth of a thin film such as silicon on a semiconductor crystal substrate.

In the production process of a semiconductor crystal thin film in the prior art, a reaction vessel has been made of only a quartz glass in order to establish metal contaminant free environment over the entire reaction zone. In the case of a horizontal type vapor phase growth apparatus, a reaction vessel of which length direction is horizontal and which has a rectangle cross section is made of a quartz glass and a transfer port for replacing a substrate had to be mounted at the upstream side or the downstream side of a substrate setting position in the reaction vessel.

In the reaction vessel of a horizontal type vapor phase growth apparatus, polycrystal particles which are produced by a side reaction of raw material reactant gases are used to accumulate at the reaction vessel wall at the downstream side of the substrate setting position, therefore, when a loading and unloading of a substrate is performed from the downstream side of the substrate setting position, the polycrystal particles exfoliated from the wall adhere to a transferring substrate and a vapor phase growth processed thin film surface, then ratio of a surface defect increases. Accordingly, the loading and unloading of the substrate has to be managed at the upstream side of the substrate setting position.

As is shown in FIG. 10, in the case of the loading and unloading of the substrate 41 from the upstream side of the substrate setting position, a gas supply part 23 through which a mixture gas 33 consisting of a raw material gas 31 (source gas containing a necessary quantity of a dopant) and a carrier gas 32 is arranged close to a transfer port 27 through which the substrate 41 is loaded and unloaded. For example, a nozzle 22 introducing the mixture gas 33 is vertically mounted to a upside wall 21a of the reaction vessel 21, and the transfer port 27 is mounted at an end wall 21e of the upstream side of the reaction vessel 21.

One of the roles of the nozzle 22 is adjustment of flow rate or concentration of the mixture gas 33. For example, in order to establish homogeneity of the thickness and resistivity of the thin film 42 within a surface of the substrate as shown in FIG. 11, a right side supply port 24, a central supply port 25, and a left side supply port 26 are mounted in the reaction vessel 21, through these ports raw material gas has been supplied with adjusting properly the concentration of a source gas and a dopant gas in a width direction of the reaction vessel.

The nozzle 22 consisting of gas supply ports 24 to 26 in FIG. 10 is mounted vertically to the upside wall 21a, and through the nozzle 22 the mixture gas 33 is introduced to the reaction vessel 21, then just after introduction of the mixture gas 33, a vortex 34 is formed by the mixture gas 33. Therefore, the concentration distribution settled at the nozzle part will be equalized by a long time of stagnation of the raw material gas 31 in the vortex 34 and moreover by a diffusion and stirring of gas flow, though the concentration distribution preliminary formed in the width direction of the reaction vessel at the gas supply port 24 to 26, and it is difficult to establish the homogeneity of the film thickness and the resistivity above said. In FIGS. 10 and 11, 21b, 21c and 21d are a bottom wall, a right side wall and a left side wall, respectively.

SUMMARY OF THE INVENTION

For the improvement of the previously described inconvenience, this invention is introduced. The object of this invention is to supply a vapor phase growth method and a horizontal type vapor phase growth apparatus so as to have a specified distribution of a thin film thickness and resistivity formed on a substrate by adjusting and controlling properly a concentration distribution of source gas and dopant gas in a raw material gas which is flowing near the surface of the substrate.

The first aspect of this invention resides in a vapor phase growth method of a thin film on a surface of a semiconductor crystal substrate in a reaction vessel arranged horizontally with a transfer port of the semiconductor crystal substrate being mounted at one end and a gas exhaust port being mounted at the other end, then the thin film being formed on the semiconductor crystal substrate arranged horizontally in the reaction vessel by flowing horizontally a mixture gas containing a raw material gas and a carrier gas over the semiconductor crystal substrate, characterized in the step that the carrier gas is supplied from the position close to the transfer port of the semiconductor crystal substrate, and the raw material gas adjusted its concentration distribution in the width direction of the reaction vessel is supplied from the position located in the downstream side of a vortex generation region caused by the flow of the carrier gas, then the thin film is formed on the semiconductor crystal substrate loaded in the downstream side of the raw material gas supply port.

The second aspect of this invention resides in an apparatus for vapor phase growth of a thin film on a surface of a semiconductor crystal substrate, comprising a reaction vessel arranged horizontally with a transfer port of the semiconductor crystal substrate being mounted at one end and a gas exhaust port being mounted at the other end, then the thin film being formed on the semiconductor crystal substrate arranged horizontally by flowing horizontally a mixture gas containing a raw material gas and a carrier gas over the semiconductor crystal substrate, characterized in that an upstream side gas supply port(s) is mounted perpendicularly to the direction of the mixture gas flow at a position close to the transfer port of the semiconductor crystal substrate, and a plurality of the downstream side gas supply ports are juxtaposed at a position located in the downstream side of the upstream side gas supply port(s) separated with a constant distance L (cm), and the distance L is to be decided to satisfy the following formula (1).

$$L \geq 1.8H + 1.0 \tag{1}$$

where H is internal height of the reaction vessel at the region where the upstream side gas supply port(s) is mounted, and loading position of the semiconductor crystal substrate is in the downstream side of the downstream side gas supply ports, and the carrier gas is supplied from the upstream side gas supply port(s), the raw material gas being controlled its concentration distribution in the width direction of the reaction vessel is supplied from the downstream side gas supply ports.

The invenors of this invention have investigated the reaction vessel of the vapor phase growth apparatus of the above horizontal type based on a fluid characteristics. As is shown in FIG. 10, the inventors have found that a vortex will be generated inevitably whenever the mixture gas 33 consisting of raw material gas 31 and carrier gas 32 is introduced from the port which is located close to the transfer port 27 of the substrate 41 and is located at the upstream side or the downstream side of the substrate loaded position with the flow direction of ascending or descending way.

As is shown in FIGS. 1 and 2, the carrier gas 32 is introduced to the reaction vessel 1 from the upstream side gas supply ports 12 to 14 perpendicularly to the flow direction of the mixture gas 33, then carrier gas 32 introduced from the gas supply ports 12 to 14 generates a vortex at the flow bending region, as it has occurred in a conventional apparatus.

In FIGS. 1 and 2, so as to avoid an adverse effect of a vortex, the downstream side gas supply ports 17 to 19 are juxtaposedly mounted in the width direction of the reaction vessel at the position where it separates the distance L (cm) from the vortex generation region into downstream side, and through these gas supply ports, raw material gas 31 consisting of source gas and required amount of dopant gas is introduced with a concentration distribution by adjusting a flow rate and concentration in the width direction of the reaction vessel.

As a result, raw material gas 31 introduced from the downstream side gas supply ports 17 to 19 to the reaction vessel 1 does not receive an unnecessary stirring from the carrier gas in which a vortex turbulence is disappeared, therefore raw material gas 31 flows horizontally keeping the concentration distribution in the width direction of reaction vessel and the concentration distribution of source gas and dopant gas of the raw material gas flowing close to the surface of the substrate 41 can be controlled properly.

In this case, it is very important to decide the distance L between the upstream side gas supply ports 12 to 14 and the downstream side gas supply ports 17 to 19. By the investigations of the inventors, the distance L is proportional to the internal height H (cm) of the reaction vessel 1, where the internal height H denotes the internal distance between an upside wall 1a and a bottom wall 1b.

In FIGS. 1 and 2, 1c is a right side wall, 1d is a left side wall, 1e is an end wall, 2, 3, 4 and 8 are nozzles, 7 is a transfer port of the substrate 41.

According to the experiments conducted by the inventors of this invention, within the flow rate range of the carrier gas applied in ordinary use to grow thin film 42, it is confirmed that there exists a proportional relation between the minimum distance L (cm) where the raw material gas 31 dose not receive the influence of a vortex 34 and the internal height H (cm) as the flow width of the carrier gas 32 in a practical thin film formation region as shown in FIG. 3. Accordingly, in a practical thin film formation, the distance L (cm) has to be equal to Lm, or preferably, larger than Lm, that is, the relation given by equation (1) has to be satisfied.

DETAILED DESCRIPTION OF THE PREFERRED EMBODIMENT

Here, as shown in FIGS. 1 to 9, an example of embodiment on the production of a silicon single crystal thin film is given by using the appratus of this invention.

Figure 1:
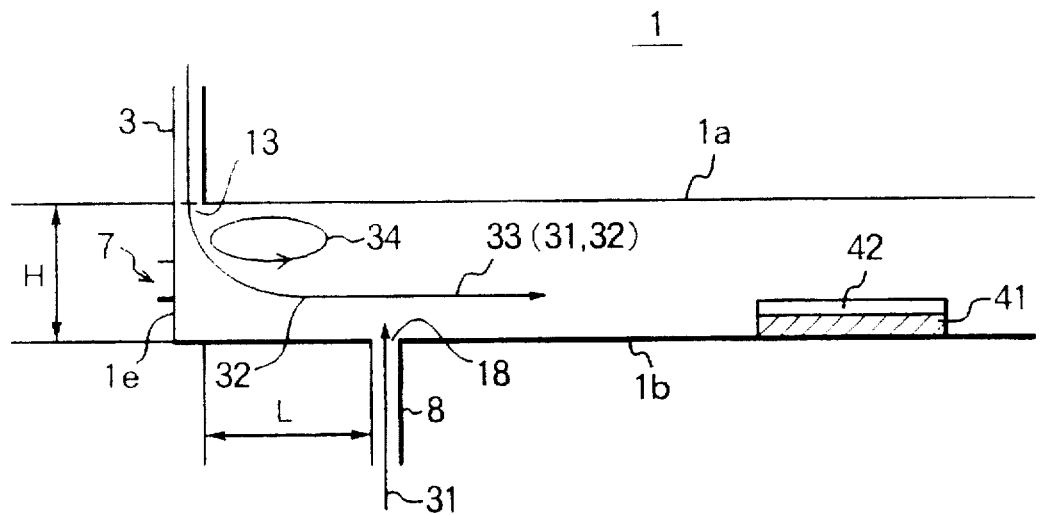
FIG. 1 is a schematic section of a reaction vessel showing embodiment of this invention.
Figure 2:
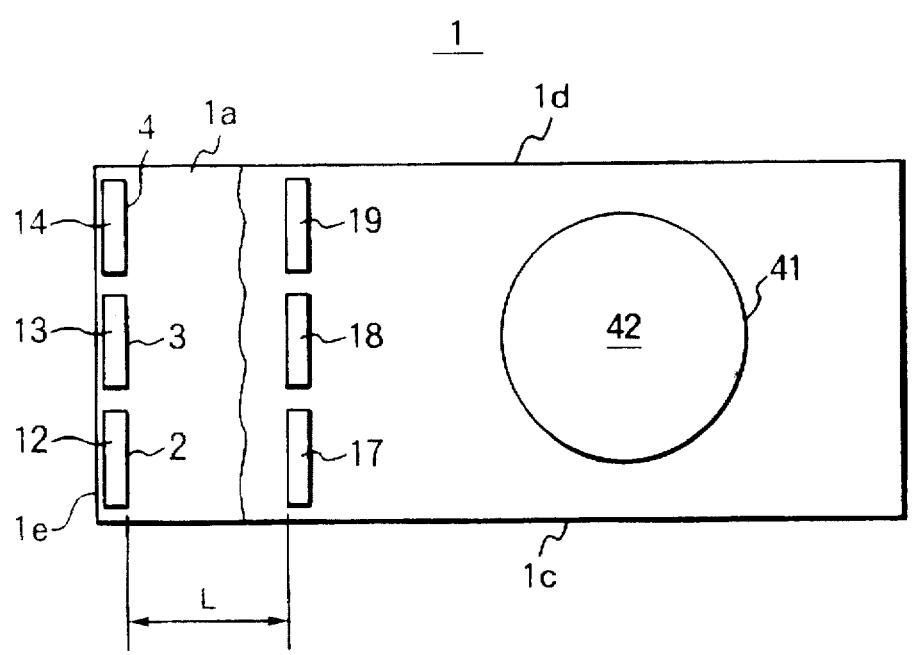
FIG. 2 is a planview of the cross section of the reaction vessel in FIG. 1.
Figure 3:
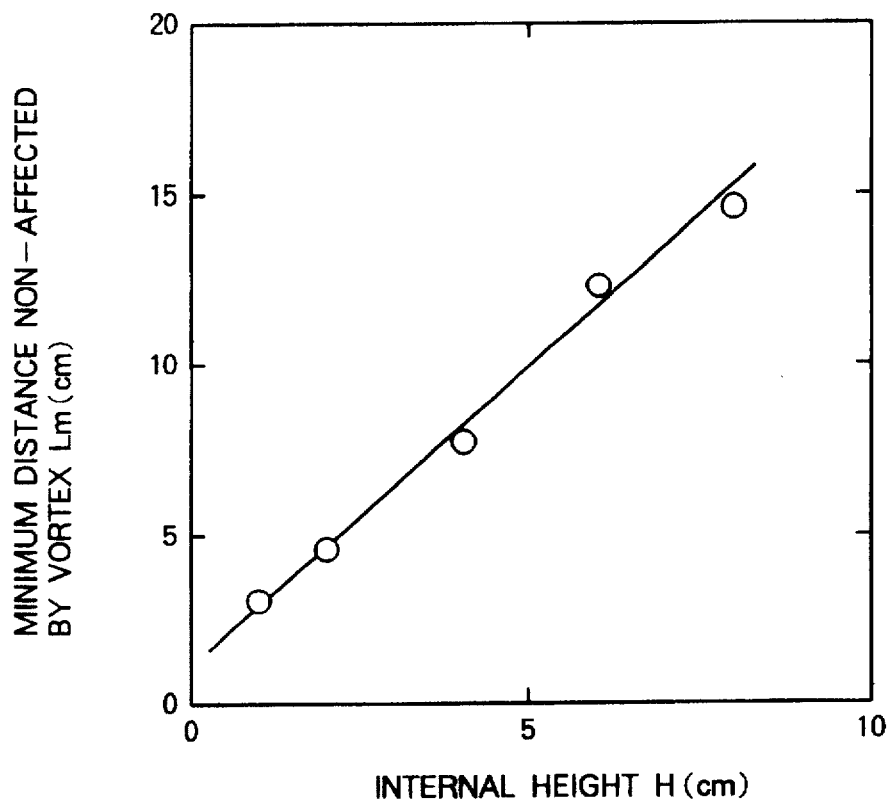
FIG. 3 is a graph giving the relation between L and H, in which L is a distance between the upstream side gas supply port and the downstream side gas supply port and H is a internal height of the reaction vessel.

As is shown in FIG. 1, as gas supply ports, upstream side gas supply ports 12 to 14, downstream side gas supply ports 17 to 19 are mounted on a quartz glass reaction vessel 1 which is rectangular in section and arranged horizontally and moreover, the gas supply ports having relatively large aperture section are divided into three sections such as right gas supply ports 12, 17, central gas supply ports 13, 18 and left gas supply ports 14, 19.

In the procedure of the vapor phase growth, hydrogen gas as a carrier gas of total flow rate 90 liters/min was introduced through the upstream gas supply ports 12 to 14, that is, right gas supply port 12, central gas supply port 13, and left gas supply port 14. And trichlorosilane gas as a raw material gas mixed with p-type dopant diborane gas were introduced by such a mixing ratio, hydrogen 10 liters/min, trichlorosilane 10 g/min and diborane 6×10$^{15}$ molecules/min through the downstream side gas supply ports 17 to 19, that is, right gas supply port 17, central gas supply port 18, and left supply port 19.

As to the reaction vessel 1, internal height H was given 2 cm, and distance between upstream gas supply ports 12 to 14 and downstream gas supply ports 17 to 19 was given 10 cm, this value of 10 cm was larger than the calculated value of 4.6 cm based on the formula (1).

Figure 4:
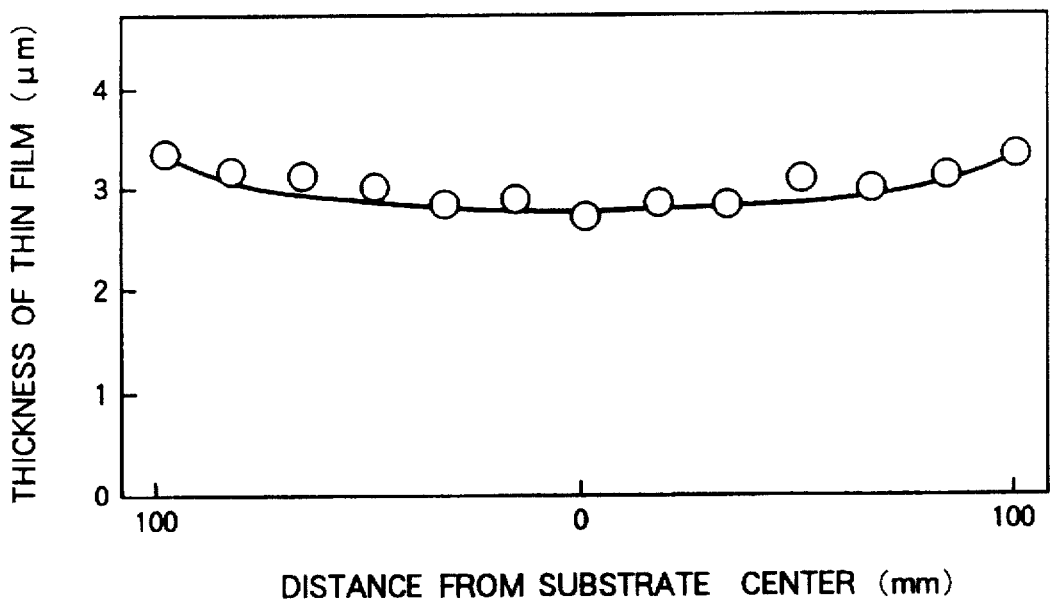
FIG. 4 is a graph in which a semiconductor crystal thin film thickness distribution formed on a substrate based on an experimental result in the embodiment of this invention.
Figure 7:
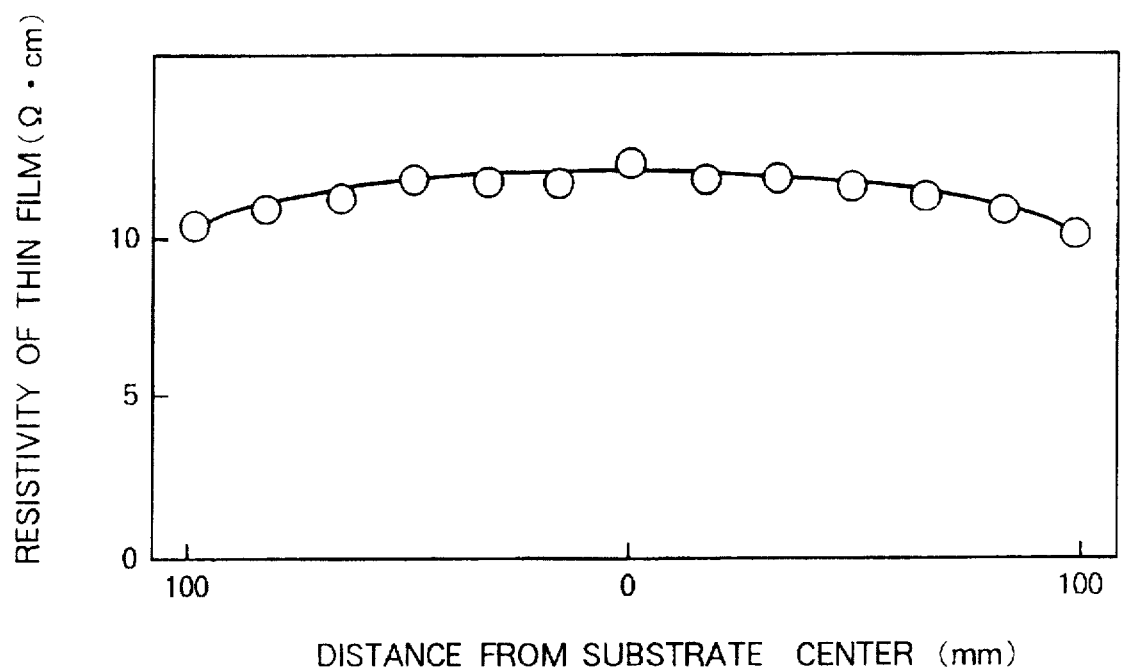
FIG. 7 is a graph in which a semiconductor crystal thin film resistivity distribution formed on a substrate based on an experimental result in the embodiment of this invention.

In the procedure of vapor phase growth, a p-type silicon single crystal substrate 41 having a dimension of 200 mm in diameter, its resistivity 0.015 Ω.cm was mounted at the downstream side of the downstream side gas supply ports 17 to 19. The temperature of the substrate 41 was increased to 1100° C., each flow rate of the raw material gas 31 in the gas supply ports 17, 18 and 19 was equalized, then a thin film 42 of silicon single crystal was formed on the substrate 41 for one minute. As is shown in FIG. 4, a thin film was obtained in which the periphery part of the substrate 41 was thicker compared with the center part according to the thickness distribution of thin film 42 over the substrate surface. On the other hand, as for the resistivity, lower values were obtained at the periphery part of the substrate 41 as is shown in FIG. 7.

Figure 5:
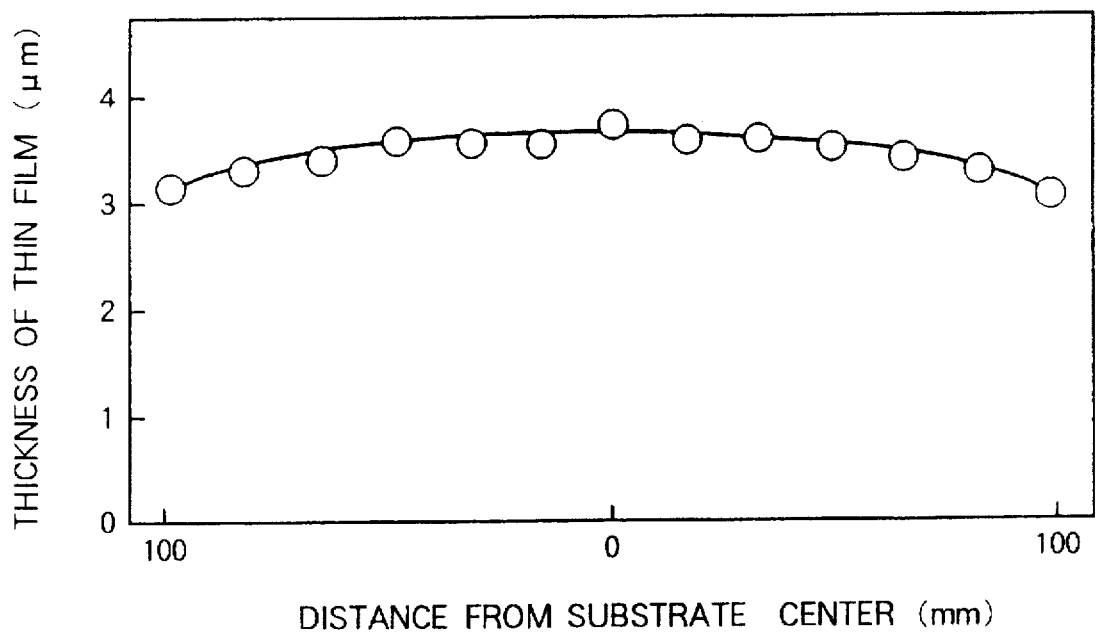
FIG. 5 is a graph in which a semiconductor crystal thin film thickness distribution formed on a substrate based on another experimental result in the embodiment of this invention.
Figure 8:
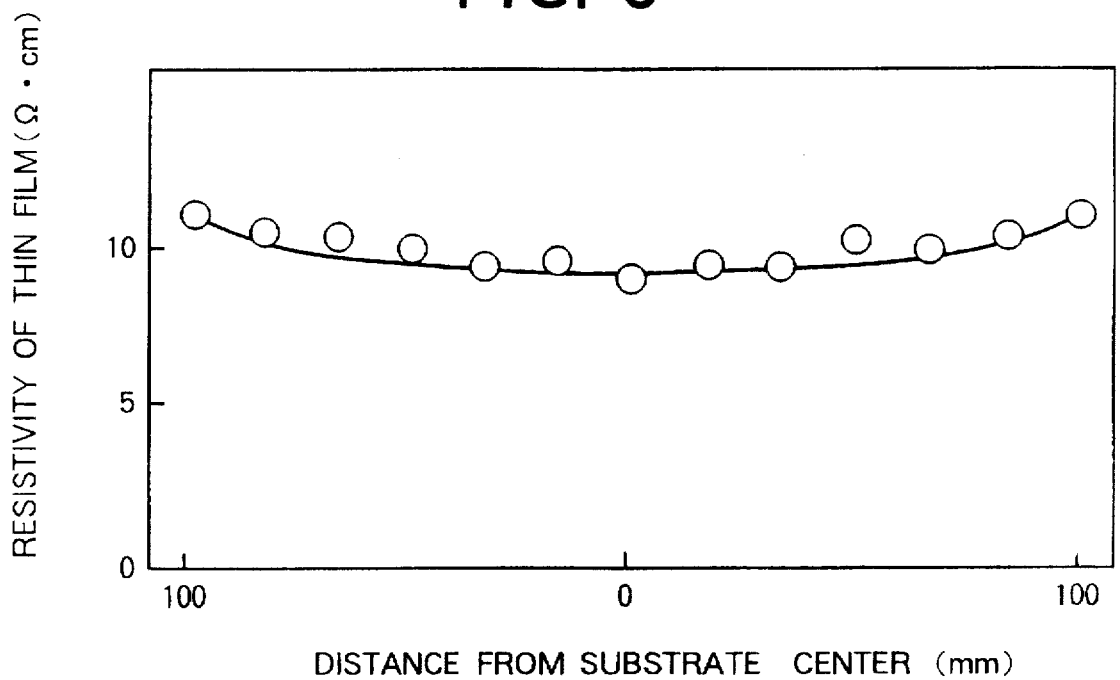
FIG. 8 is a graph in which a semiconductor crystal thin film resistivity distribution formed on a substrate based on another experimental result in the embodiment of this invention.

Then another formation of the thin film was performed as follows: the flow rates of the right gas supply port 17, the left gas supply port 19 and the central gas supply port 18 were chosen 20%, 20% and 60% of the total flow rate of the raw material gas 31, respectively, and all of the other conditions and process time were the same as described above. A thin film was obtained with a thickness being thinner at the periphery part of the substrate 41 as shown in FIG. 5 and a resistivity distribution being higher at the perphery part of the substrate as shown in FIG. 8.

Figure 6:
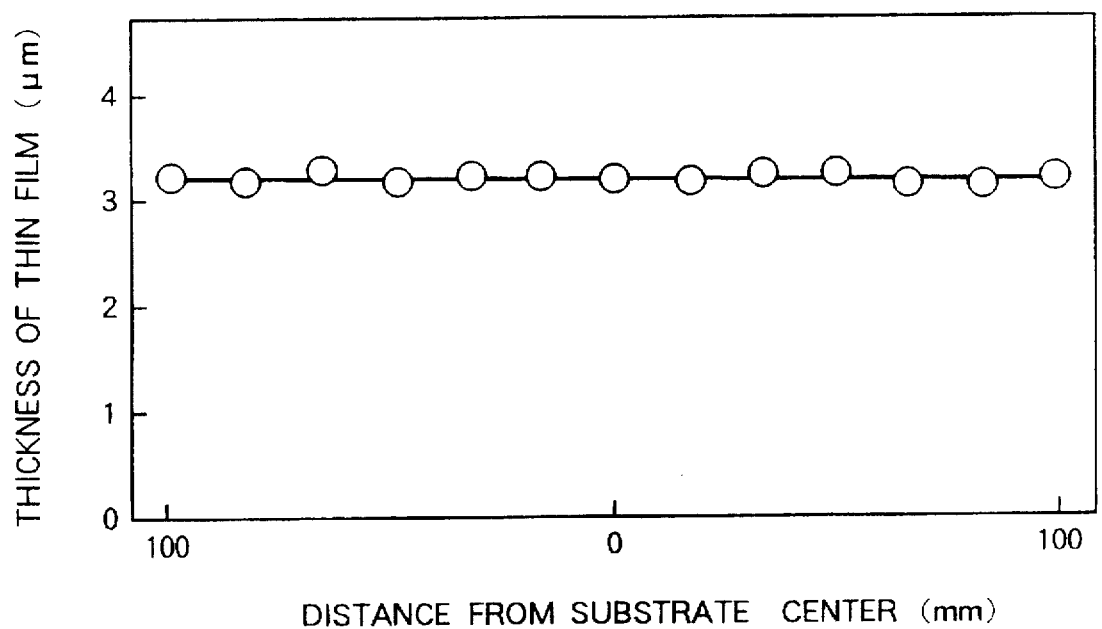
FIG. 6 is a graph in which a semiconductor crystal thin film thickness distribution formed on a substrate based on other experimental result in the embodiment of this invention.
Figure 9:
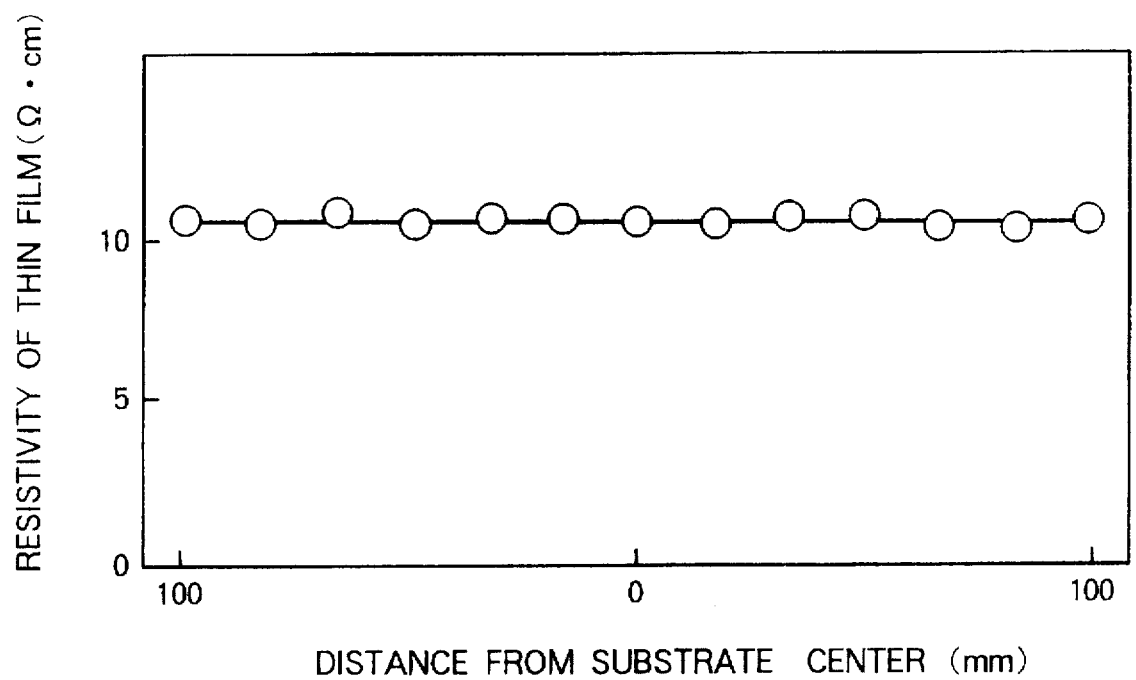
FIG. 9 is a graph in which a semiconductor crystal thin film resistivity distribution formed on a substrate based on the other experimental result in the embodiment of this invention.
Figure 10:
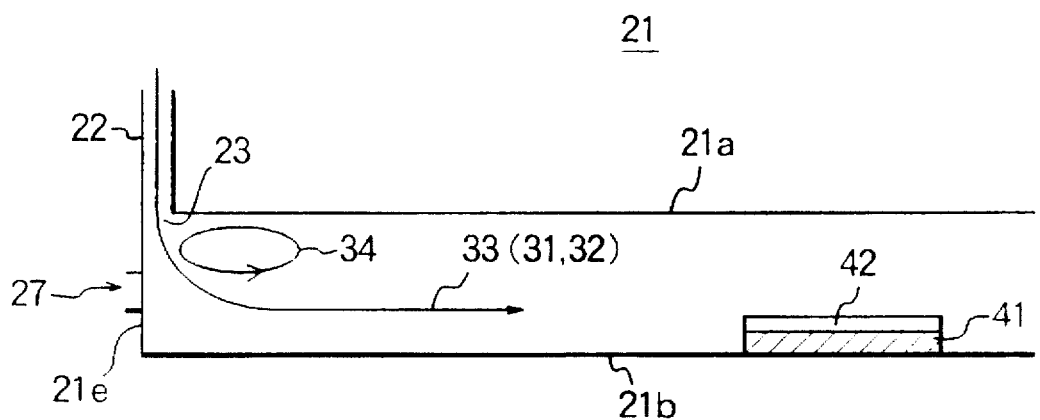
FIG. 10 is a schematic cross section of a reaction vessel which is comprised in a conventional horizontal type vapor phase growth apparatus.
Figure 11:
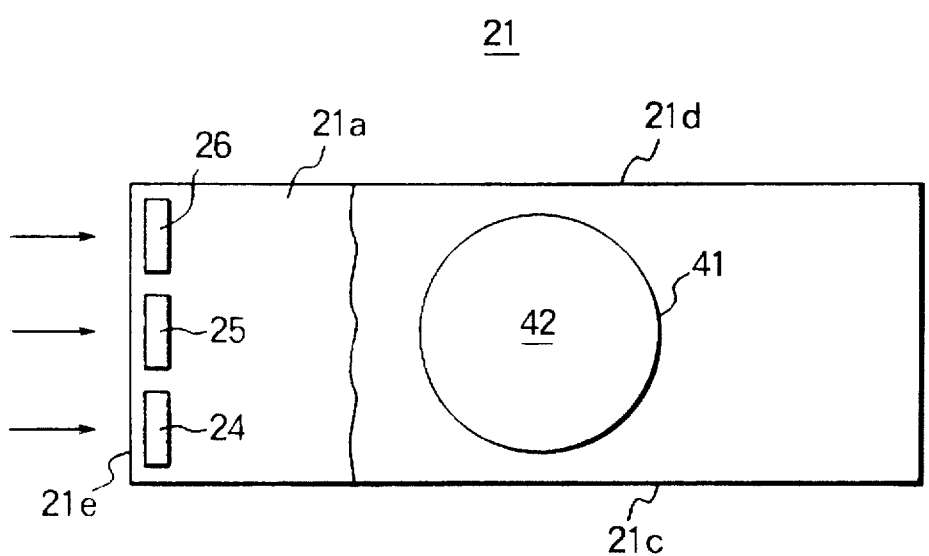
FIG. 11 is a schematic plan view of a reaction vessel which is comprised in a conventional horizontal type vapor phase growth apparatus.

In order to establish a homogeneous thin film thickness distribution in the thin film 42, the flow rates of the right gas supply port 17, the left gas supply port 19 and the central gas supply port 18 were chosen 27%, 27% and 46% of the total flow rate of the raw material gas 31, respectively and other formation of the thin film was performed with all of the other conditions and process time were the same as described above. A homogeneous distribution of the thin film thickness and resistivity over the substrate was obtained as shown in FIGS. 6 and 9.

As is described above, by adjusting the flow rate ratio of the raw material gas 31 flowing through each port of the downstream side gas supply ports 17 to 19, the distribution of the source gas concentration and dopant concentration in the width direction of the reaction vessel in the mixture gas 33 flowing over the surface of the substrate 41 could be properly controlled, therefore it was confirmed that the distribution of the thickness and resistivity of the thin film 42 can be easily controlled.

The distance L between the upstream side gas supply ports 12 to 14 and the downstream side gas supply ports 17 to 19 is determined by the internal height H of the reaction vessel 1 in which the processing gas flows in a horizontal direction. Here, the same kind of experiments as the above were conducted by such conditions: the internal height H was not higher than 10 cm, and the carrier gas flow rate was in the range of 50 to 150 liters/min. The results of the experiments were as follows: the thickness and resistivity could be controlled by following the formula (1), even though the reaction times themselves varied due to the flow rate of the carrier gas 32.

Experimental results on the formation of the thin film 42 of silicon single crystal at 1100° C. were given in the above, however, in the case of silicon single crystal, the above formula (1) is valid for the reactant gas tranport-rate limited condition of raw material gas 31, especially effective for the thin film thickness control at the temperature 1000° to 1200° C., and also effective for the resistivity control under the reaction-rate limited region below 1000° C.

In the embodiment described above, the concentration distribution of raw material gas in the mixture gas flowing over the surface of the substrate could be adjusted by controlling the flow rate ratio of raw material gas in the width direction of the reaction vessel. Alternatively, the the same effect can be obtained by controlling the concentration of raw material gas in the width direction of the reaction vessel. In the embodiment described above, the formation of a silicon single crystal thin film on a silicon single crystal substrate is given, further, in this invention, it is also possible to form an semiconductor single crystal thin film other than silicon on a semiconductor single crystal substrate other than silicon.

In the case of a thin film formation apparatus of horizontal gas flow type, it is effective to control the thin film thickness at the reactant gas transport-rate limited condition of raw material gas and also effective to control the resistivity at the reaction-rate limited condition at low temperature.

As is explained clearly in the previous description, the constitution of this invention is as follows: a plurality of parallel downstream side gas supply ports are mounted in the width direction of the reaction vessel, the raw material gas in which the flow rate or concentration of the source gas or the dopant gas is properly adjusted is supplied from each of a plurality of the downstream side gas supply ports at the downstream side position where a vortex generated at the upstream side of the reaction vessel is ceased. Therefore, the concentration distribution of the source gas and dopant gas in the width direction of the reaction vessel can be properly controlled and adjusted over the substrate surface.

Accordingly, distribution of the thickness and resistivity of the thin film which is formed on the surface of the substrate can be adjusted easily.

What is claimed is:

1. A method for vapor phase growth of a thin film on a surface of a semiconductor crystal substrate in a reaction vessel comprising the steps of:

Arranging horizontally the reaction vessel with a transfer port for the semiconductor crystal substrate being mounted at one end and a gas exhaust port being mounted at the other end, wherein a thin film is formed on the semiconductor crystal substrate arranged horizontally in the reaction vessel by a horizontally flowing gas mixture containing a raw material gas and a carrier gas over the semiconductor crystal substrate;

Loading the semiconductor crystal substrate downstream of raw material gas supply ports;

Supplying the carrier gas from carrier gas supply ports positioned close to the transfer port for the semiconductor crystal substrate;

Supplying the raw material gas adjusted its concentration distribution in a width direction of the reaction vessel from a position located downstream from a vortex generation region caused by a flow of the carrier gas; and Forming the thin film on the semiconductor crystal substrate loaded in the downstream side of the raw material gas supply port.

2. The method in accordance with claim 1 further comprising the step of mounting the carrier gas supply port perpendicular to the direction of the mixture gas flow at a position close to the transfer port for the semiconductor crystal substrate.

3. The method in accordance with claim 2 further comprising the step of mounting the raw material gas supply ports at a position separated from said carrier gas supply ports at a constant distance L, where L is according to the formula.

$$L \geq 1.8H + 1.0$$

where H is the internal height of the reaction vessel.

* * * * *